(12) United States Patent
Vakhshoori et al.

(10) Patent No.: US 6,775,316 B2
(45) Date of Patent: Aug. 10, 2004

(54) METHOD AND APPARATUS FOR INTEGRATING A VERTICAL CAVITY SURFACE EMITTING LASER WITH A OPTICAL AMPLIFIER

(75) Inventors: Daryoosh Vakhshoori, Cambridge, MA (US); Masud Azimi, Nashua, MI (US)

(73) Assignee: Nortel Networks Ltd., St. Laurent (CA)

(*) Notice: Subject to any disclaimer, the term of this patent is extended or adjusted under 35 U.S.C. 154(b) by 12 days.

(21) Appl. No.: 10/079,313

(22) Filed: Feb. 20, 2002

(65) Prior Publication Data

US 2002/0176476 A1 Nov. 28, 2002

Related U.S. Application Data

(60) Provisional application No. 60/270,008, filed on Feb. 20, 2001.

(51) Int. Cl.[7] .................................................. H01S 3/10
(52) U.S. Cl. .......................... 372/109; 372/20; 372/45; 372/64
(58) Field of Search ........................... 372/20, 108, 64, 372/26, 45, 75, 109

(56) References Cited

U.S. PATENT DOCUMENTS

| | | | | |
|---|---|---|---|---|
| 5,841,099 A | * | 11/1998 | Owen et al. | ............ 219/121.69 |
| 5,844,149 A | * | 12/1998 | Akiyoshi et al. | ......... 73/864.81 |
| 5,930,423 A | * | 7/1999 | Chen et al. | .................... 385/49 |
| 6,186,631 B1 | * | 2/2001 | Behringer et al. | .......... 359/344 |
| 6,325,553 B1 | * | 12/2001 | Deacon et al. | ................. 385/89 |
| 6,347,104 B1 | * | 2/2002 | Dijaili et al. | ............. 372/38.01 |
| 6,526,089 B1 | * | 2/2003 | Haeno et al. | ................ 372/101 |
| 6,542,533 B1 | * | 4/2003 | Parayanthal | .................. 372/64 |
| 2002/0064192 A1 | * | 5/2002 | Missey et al. | ................. 372/20 |
| 2003/0099273 A1 | * | 5/2003 | Murry et al. | ................ 372/108 |

* cited by examiner

Primary Examiner—Don Wong
Assistant Examiner—Dung T Nguyen
(74) Attorney, Agent, or Firm—John C. Gorecki

(57) ABSTRACT

Method and apparatus for integrating a VCSEL with a SOA, comprising positioning a collimating lens adjacent to the output of the VCSEL, positioning a focusing lens adjacent to the input of the SOA, and positioning a movable lens between the collimating lens and the focusing lens, where the movable lens has a focal length significantly longer than the focal length of the focusing lens; and moving the movable lens relative to the focusing lens so as to adjust the focusing spot on the input of the SOA.

19 Claims, 2 Drawing Sheets

METHOD AND APPARATUS FOR INTEGRATING A VERTICAL CAVITY SURFACE EMITTING LASER WITH A OPTICAL AMPLIFIER

REFERENCE TO PENDING PRIOR PATENT APPLICATION

This patent application claims benefit of pending prior U.S. Provisional Patent Application Ser. No. 60/270,008, filed Feb. 20, 2001 by Daryoosh Vakhshoori et al. for METHOD AND APPARATUS FOR INTEGRATING A VCSEL WITH A SOA, which patent application is hereby incorporated herein by reference.

FIELD OF THE INVENTION

This invention relates to optical systems in general, and more particularly to methods and apparatus for optically connecting components in optical systems.

BACKGROUND OF THE INVENTION

Vertical cavity surface emitting lasers (VCSELs) that are adapted for use at longer wavelengths (e.g., 1310 nm and longer) are generally relatively difficult to make and tend to have relatively low output power. Amplification of the largest output signal may be necessary in order to boost the power to the level necessary for telecommunications or other applications. One method for achieving this amplification is to co-package a semiconductor optical amplifier (SOA) with the VCSEL in a module, with the coupling between the VCSEL and the SOA being achieved by free space optics. However, effecting proper alignment of the VCSEL, SOA and intervening optics can be difficult.

SUMMARY OF THE INVENTION

As a result, one object of the present invention is to provide a method and apparatus for quickly and easily effecting proper alignment of the VCSEL, SOA and intervening optics.

These and other objects are addressed by the provision and use of the present invention which, in one form of the invention, comprises a method for integrating a VCSEL with a SOA, comprising: positioning a collimating lens adjacent to the output of the VCSEL, positioning a focusing lens adjacent to the input of the SOA, and positioning a movable lens between the collimating lens and the focusing lens, where the movable lens has a focal length significantly longer than the focal length of the focusing lens; and moving the movable lens relative to the focusing lens so as to adjust the focusing spot on the input of the SOA.

In another aspect of the invention, there is provided apparatus for integrating a VCSEL with a SOA, comprising: a collimating lens positioned adjacent to the output of the VCSEL; a focusing lens positioned adjacent to the input of the SOA; and a movable lens positioned between the collimating lens and the focusing lens, where the movable lens has a focal length significantly longer than the focal length of the focusing lens.

And in another aspect of the invention, there is provided a method for integrating a VCSEL with a SOA, comprising: providing a VCSEL and providing a SOA; and butt-coupling the output coupler of the VCSEL to the input facet of the SOA, wherein the output facet of the SOA is angled with respect to the input facet of the SOA and the input facet of the SOA is anti-reflection coated to prevent excessive feedback to the VCSEL.

And in another aspect of the invention, there is provided an assembly comprising: a VCSEL; a SOA; the output coupler of the VCSEL being butt-coupled to the input facet of the SOA, wherein the output facet of the SOA is angled with respect to the input facet of the SOA, and the input facet of the SOA is anti-reflection coated so as to prevent excessive feedback to the VCSEL.

BRIEF DESCRIPTION OF THE DRAWINGS

These and other objects and features of the present invention will be more fully disclosed by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

Figure 1:
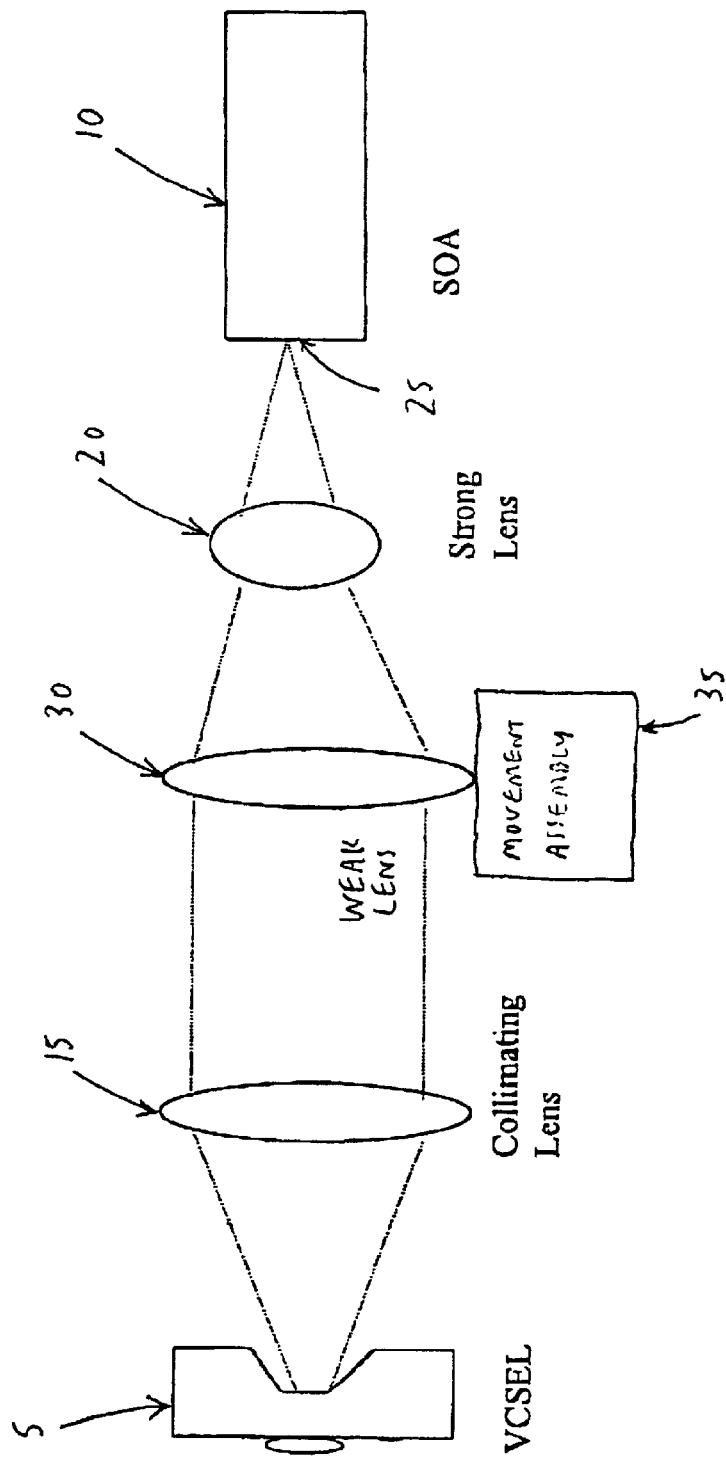
FIG. 1 is a schematic view showing an arrangement for integrating a VCSEL with a SOA.

Looking first at FIG. 1, the present invention provides a method and apparatus for integrating a VCSEL 5 with a SOA 10.

More particularly, a collimating lens 15 is used to collimate the output beam of VCSEL 5. This collimated beam is then focused by a focusing lens 20 onto a facet 25 of the SOA 10 so as to provide an input signal to the SOA for amplification. Since the typical mode of the SOA 10 is small (e.g., 2–4 microns in diameter), it is difficult to maintain proper optical alignment during attachment of the lens elements 15 and 20. As a result, there is typically a "post attachment shift" that needs to be corrected.

In accordance with the present invention, it has been discovered that a "weak" lens 30 can be used to finely align the output of VCSEL 5 to the input of SOA 10. More particularly, the weak lens 30, which has a much longer focal length than that of the focusing lens 20, can be positioned along the optical path between collimating lens 15 and focusing lens 20. The ratio between the focal length of the weak lens 30 and the focusing (or strong) lens 20 can be, for example, 10 to 1. Because of the long focal length of the weak lens 30 compared to the focal length of the focusing lens 20, a movement of the weak lens 30 in the transverse direction by X microns will move the focusing spot on the facet 25 of the SOA 10 by about X/10 microns. As a result, appropriate movement of the weak lens 30 in a direction transverse to the light path can be used to appropriately adjust the focusing spot on the facet 25 of SOA 10, whereby to finely align the output of VCSEL 5 to the input of SOA 10.

A movement assembly 35 may be provided to move the weak lens 30 transversely relative to the optical path. This movement assembly 35 may be adapted to move the weak lens 30 in one or more axes transverse to the axis of the light path. By way of example, in a standard three dimensional X-Y-Z coordinate system, if the light path between VCSEL 5 and SOA 10 is considered to extend in the Z direction, the movement assembly 35 may be adapted to move the weak lens 30 in the X direction, or in the Y direction or, more preferably, in both the X and Y directions. Such a lens movement assembly 35 may be of the sort well known to those skilled in the art, e.g., an automated X-Y-Z movement assembly controlled by sensors and including a feedback loop to facilitate proper positioning of the weak lens 30.

Figure 2:
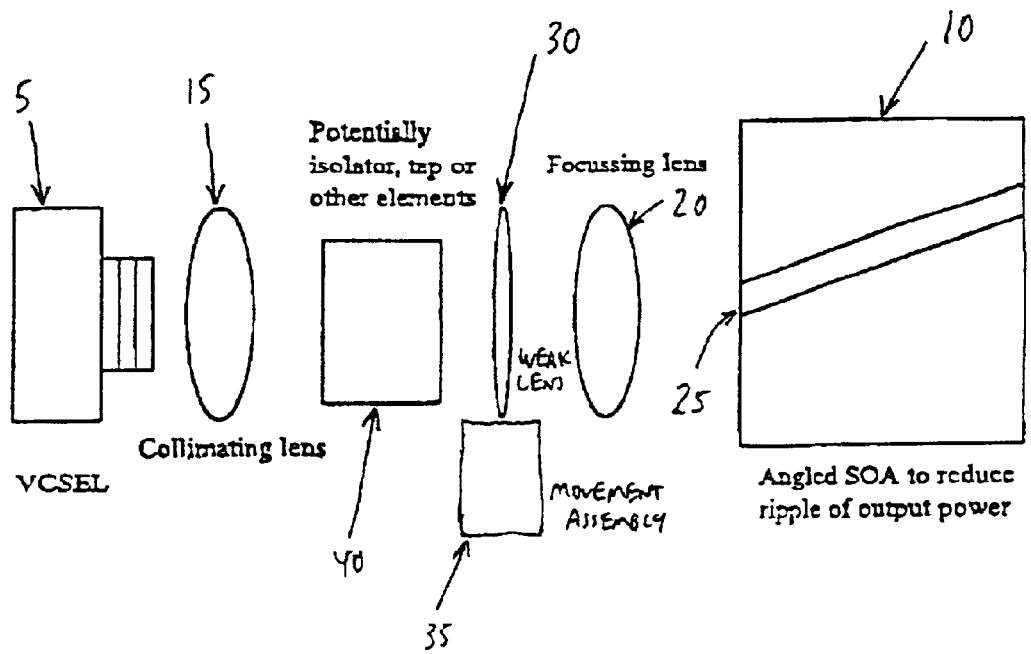
FIG. 2 is a schematic view showing another arrangement for integrating a VCSEL with a SOA.

In some circumstances, other free space elements (e.g., optical isolators, beam splitters, etc.) may be positioned between collimating lens 15 and weak lens 30. By way of example but not limitation, it is often desirable to provide an optical isolator between VCSEL 5 and SOA 10 in order to prevent feedback from SOA 10 to VCSEL 5, which can result in instability of the VCSEL output. See, for example, FIG. 2, where an element 40, which could be an optical isolator, is shown interposed between collimating lens 15 and weak lens 30. In this respect it should also be appreciated that if an optical isolator or beam splitter or other element 40 is used in the collimation path, the weak lens 30 can potentially be attached to the housing of such element 40.

Since the VCSEL 5 generally has a circularly shaped mode, and a typical SOA 10 generally has an elliptical mode, an optimal SOA should have a mode expander positioned in front of the input facet 25 of the SOA 10. Such a mode expander is adapted to make the elliptical mode of the SOA more circular. Such a mode expander may be of the sort well known to those skilled in the art. By positioning a mode expander in front of the input facet 25 of SOA 10, there will be a better coupling of the VCSEL output power into the SOA which would help the optical to signal ratio (OSNR). Furthermore, with better coupling, for a given level of VCSEL power incident on the input facet of the SOA, more output power is obtained at an output facet of the SOA. Additionally, since the typical goal is to couple the output of VCSEL 5 to an optical fiber, and since the optical fiber has a circular mode, there is a further benefit from providing a mode-expanded SOA, which then more closely matches the SOA mode to that of the fiber.

For some applications, it is cheaper to co-package polarization-insensitive SOAs with VCSELs. Furthermore, as noted above, it is generally desirable to position an optical isolator between VCSEL 5 and SOA 10 in order to prevent feedback from the SOA to the VCSEL. Since low cost isolators are polarization dependent, this generally requires that the output of the VCSELs have linear polarization.

Figure 3:
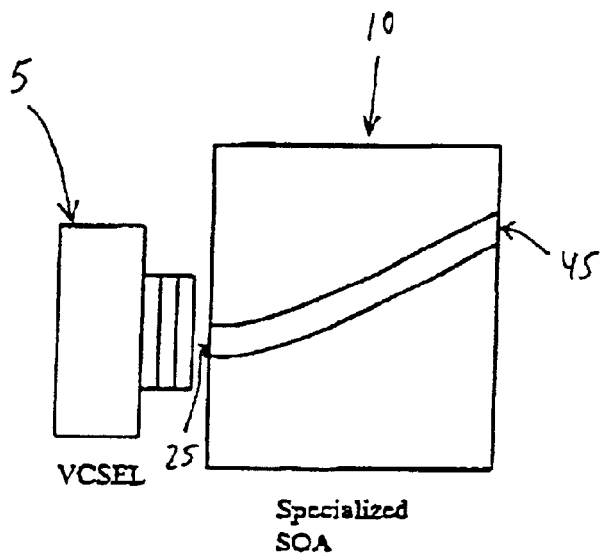
FIG. 3 is a schematic view showing still another arrangement for integrating a VCSEL with a SOA.

In accordance with a further feature of the invention, and looking now at FIG. 3, a SOA 10 with a specialized geometry can be butt-coupled to the VCSEL 5 so as to eliminate the need for an isolator and expensive lens costs. More particularly, the input facet 25 of the SOA 10 is butt-coupled to the output coupler of VCSEL 5, and the output facet 45 of the SOA 10 is angled with respect to the cleaved facet 25 of the SOA. The input facet 25 is anti-reflection (AR) coated so as to prevent too much feedback to the VCSEL. By way of example but not limitation, input facet 25 may have an anti-reflection coating of 0.1% or better.

Furthermore, since the separation between the input facet 25 of the SOA 10 and the output coupler of VCSEL 5 is small (e.g., a few microns), the free spectral range of the etalon thus created is large (more than tens of nanometer), so that even if a tunable VCSEL is used as the input source, the level of feedback will not change significantly during VCSEL tuning. Such residual, substantially constant feedback may not be detrimental to VCSEL operation. The output facet 45 of SOA 10 is also AR coated, and angled, so as to ensure that there is relatively little feedback to the SOA 10 and hence to VCSEL 5. In a preferred embodiment of the invention, less than −50 dB feedback is generated.

A mode expanded SOA 10 can also be used in conjunction with the aforementioned butt-coupling geometry shown in FIG. 3.

What is claimed is:

1. A method for integrating a VCSEL with a SOA, comprising:

positioning a collimating lens adjacent to the output of the VCSEL, positioning a focusing lens adjacent to the input of the SOA, and positioning a movable lens between the collimating lens and the focusing lens, where the movable lens has a focal length significantly longer than the focal length of the focusing lens; and moving the movable lens relative to the focusing lens so as to adjust the focusing spot on the input of the SOA.

2. A method cording to claim 1 wherein the movable lens is moved transverse to the light path between the VCSEL and the SOA.

3. A method according to claim 1 wherein the movable lens has a focal length at least five times longer than the focal length of the focusing lens.

4. A method according to claim 1 wherein the movable lens has a focal length at least ten times longer than the focal length of the focusing lens.

5. A method according to claim 1 wherein a mode expander is located between the SOA and the focusing lens.

6. A method according to claim 1 wherein an optical isolator is located between the movable lens and the collimating lens.

7. Apparatus for integrating a VCSEL with a SOA, comprising:

a collimating lens positioned adjacent to the output of the VCSEL;

a focusing lens positioned adjacent to the input of the SOA; and a movable lens positioned between the collimating lens and the focusing lens, where the movable lens has a focal length significantly longer than the focal length of the focusing lens.

8. Apparatus according to claim 7 further comprising a movable assembly for moving the movable lens relative to the focusing lens.

9. Apparatus according to claim 8 wherein the movement assembly is adapted to move the movable lens transverse to the light path between the VCSEL and the SOA.

10. Apparatus according to claim 7 wherein the movable lens has a focal length at least five times longer than the focal length of the focusing lens.

11. Apparatus according to claim 7 wherein the movable lens has a focal length at least ten times longer than the focal length of the focusing lens.

12. Apparatus according to claim 7 wherein a mode expander is located between the SOA and the focusing lens.

13. Apparatus according to claim 7 wherein an optical isolator is located between the movable lens and the collimating lens.

14. A method for integrating a VCSEL with a SOA, comprising:

providing a VCSEL and providing a SOA; and butt-coupling the output coupler of the VCSEL to the input facet of the SOA, wherein the output facet of the SOA is angled with respect to the input facet of the SOA and the input facet of the SOA is anti-reflection coated to prevent excessive feedback to the VCSEL.

15. A method according to claim 14 wherein the output facet of the SOA is also anti-reflection coated.

16. A method according to claim 14 wherein the separation between the output coupler of the VCSEL an the input facet of the SOA is sufficiently small so that the free spectral range of the etalon thus created is more than about ten nanometers.

17. An assembly comprising:

a VCSEL;

a SOA;

the output coupler of the VCSEL being butt-coupled to the input facet of the SOA, wherein the output facet of the SOA is angled with respect to the input facet of the SOA, and the input facet of the SOA is anti-reflection coated so as to prevent excessive feedback to the VCSEL.

18. An assembly according to claim 17 wherein the output facet of the SOA is also anti-reflection coated.

19. An assembly according to claim 17 wherein the separation between the output coupler of the VCSEL and the input facet of the SOA is sufficiently small so that the free spectral range of the etalon thus created is more than about ten nanometers.

* * * * *